(12) United States Patent
Kitchen (10) Patent No.: US 7,830,672 B1
(45) Date of Patent: Nov. 9, 2010

(54) ELECTROMAGNETIC SHIELDING CARRYING CASE FOR CONTACTLESS SMARTCARDS AND PERSONAL ARTICLES

(76) Inventor: Michael William Kitchen, 343 A. W. Jefferson St., Media, PA (US) 19063

( * ) Notice: Subject to any disclaimer, the term of this patent is extended or adjusted under 35 U.S.C. 154(b) by 334 days.

(21) Appl. No.: 12/215,613

(22) Filed: Jun. 27, 2008

(51) Int. Cl.
*H05K 9/00* (2006.01)
(52) U.S. Cl. .................. 361/818; 361/800; 361/816; 361/737; 174/350; 235/486
(58) Field of Classification Search ............... 361/753, 361/799, 800, 816, 818, 737; 174/350, 377; 235/486
See application file for complete search history.

(56) References Cited

U.S. PATENT DOCUMENTS

| | | | |
|---|---|---|---|
| 5,546,278 A * | 8/1996 | Bethurum | 361/737 |
| 6,121,544 A | 9/2000 | Petsinger | |
| 7,163,152 B2 * | 1/2007 | Osborn et al. | 235/486 |
| 7,523,870 B2 * | 4/2009 | Lowe | 235/486 |
| 2009/0260731 A1 * | 10/2009 | Roth et al. | 150/147 |

* cited by examiner

*Primary Examiner*—Dameon E Levi (57) ABSTRACT

An electromagnetic shielding carrying case comprising a front and middle panel hingedly connected to a rear panel. The front panel and middle panel further comprise respective electromagnetic shielding members with a card holding means affixed to each. The carrying case has a closed state wherein the continuous upstanding walls of the front and rear panels are brought into engagement with one another so as to form an enclosure around the middle panel, thus shielding contactless smartcards within from being powered up by an RFID reader. A releasable locking means affixed to a front portion of the rear panel temporarily holds front panel closed, and can be unlocked so that the front panel pivots open, creating the first open state of the carrying case wherein contactless smartcards can be inserted and removed from both card holding means. The middle panel can also be pivoted open to reveal a pocket within the rear panel that holds paper currency and the like.

10 Claims, 8 Drawing Sheets

ELECTROMAGNETIC SHIELDING CARRYING CASE FOR CONTACTLESS SMARTCARDS AND PERSONAL ARTICLES

CROSS REFERENCE TO RELATED APPLICATIONS

Not Applicable

FEDERALLY SPONSORED RESEARCH

Not Applicable

SEQUENCE LISTING OR PROGRAM

Not Applicable

BACKGROUND

1. Field of Invention

This invention relates to carrying cases, and more specifically to wallet-sized electromagnetic-shielding carrying cases for holding personal articles such as credit cards, contactless smartcards, licenses, identification cards, paper currency, receipts, tickets, and the like.

2. Prior Art

Contactless smartcards are credit card sized cards that are being marketed to consumers as an alternative to magnetic strip cards as a convenient way for storing financial and personal data. By virtue of their ability to store relatively large amounts of data on an embedded microchip, and the convenience of not having to swipe the card through a scanner or hand it to a cashier, it is projected that these cards will only continue to multiply in the coming years in the fields of banking, transportation, healthcare, insurance, social security, and other personal data. The chips used in contactless smartcards can be manufactured in a form called an RFID chip. The acronym RFID stands for Radio Frequency Identification. Contactless smartcards may also be referred to as RFID enabled cards.

In order to obtain the personal information contained on a smartcard, an RFID reader or sensor needs to be present. The RFID reader provides power to the embedded microchip via a modulated magnetic field, allowing the information to be obtained from the card. Assuming that the smartcards are not shielded by an electromagnetic-shielding enclosure, the smartcards can be powered up and accessed without the card owner's knowledge. This can typically occur in two different scenarios. In one scenario, the unauthorized scanning of an RFID enabled card can be accidental, wherein the card owner is unaware that they have come within range of an active RFID reader. In the second scenario, the scanning of the card might be intentionally executed by a party who is interested in obtaining the card owners personal information without their consent. This said party may have an RFID reader of their own which they use for this purpose. The latter scenario is an example of what has become known as RFID theft. In both of these scenarios, however, the user can no longer take a proactive role in securing information on their cards.

There are some who have invented methods of proactively securing the information on a smartcard. U.S. Pat. No. 6,121,544 issued to Petsinger describes an electromagnetic shield to prevent unauthorized access to contactless smartcards. The smartcard is inserted into a sleeve that covers the majority of the cards surfaces. A sheet of electromagnetic-shielding material in the form of a soft magnetic alloy is embedded within the sleeve. While in the sleeve, a contactless smartcard is shielded from being powered up by an RFID reader. The disadvantage of this device is that it is specifically made for a very small quantity of cards (typically one or two). The sleeve is meant to be carried in a users pocket or wallet, but this is unfavorable because it adds complication to removing cards from a users wallet. Moreover, because of the typically opaque nature of the electromagnetic-shielding material, one cannot see through it. This prevents the user from seeing which card is stored inside the sleeve. Lastly, the sleeve does not have the capability to carry any additional personal items, such as paper currency, photographs, receipts, or several other cards.

Other solutions have been presented for shielding smartcards in the form of conventional leather and fabric wallets with one or more layers of electromagnetic-shielding material embedded somewhere within them. Two companies that are using this approach are Kena Kai (www.Kenakai.com) DataSafe® wallets and DIFR WEAR (www.DIFRwear.com) wallets. Both of these companies claim to have patents pending. The shielding material in these wallets is concealed within the planar layers of leather or soft fabric material so that when the wallet is closed, the layers of material form an electromagnetic shield around the cards within.

There are several problems with this solution. First, these wallets are made to be carried in ones pocket or handbag, but while these traditional bi-fold type wallets are in ones pocket or handbag they have a tendency to pivot open slightly as a result of the user walking, running, or being jolted. When these wallets open even the slightest bit, a breach is created in the RFID shielding effect of the wallet, and the smartcards are prone to accidental or unauthorized scanning.

A second disadvantage of these RFID blocking wallets is the fact that the card pockets within them are typically not closed off in any way, even when the wallet is folded closed. Again, as a result of the user walking, running, or being jolted in some way, the smartcards within the wallet are prone to sliding out of the sleeves, and even the slightest exposure of these cards outside of the electromagnetic-shielding material can risk unauthorized and accidental reading of the smartcard.

Several of the designs of the RFID blocking wallet company Kena Kai, mentioned above, feature flaps with shielding material embedded within them that fold over the card sleeves, in addition to shielding material within the exterior panels. Some of these designs also feature a zipper along the edges of the wallet to keep the wallet shut. While this may be a more secure RFID blocking wallet, since it prevents the exterior panels from pivoting open, it becomes an added hassle for the user to unzip the wallet and fold open the interior flaps, which have a tendency to stay shut due to the often resilient nature of the thick wallet material. Moreover, the card sleeves are often deep in these wallets, making it difficult for the user to slidably remove one card with their fingers. In addition, the faces of the cards are often substantially covered by the opaque sleeves, making it difficult to see which card is in what sleeve, especially in dimly lit environments or for people with poor vision.

Another disadvantage to these RFID blocking wallets is the added labor and cost of manufacturing and constructing them. Not only does the leather or durable fabric have to be cut down to size and sewn together, but sheets of electromagnetic-shielding material have to be fabricated and cut down to size as well. It is an added cost and an added step in the manufacturing process that is often reflected in the retail price for these wallets.

Another disadvantage is that the shielding material inside these fabric wallets is often substantially thin, flimsy, and prone to bending, deforming or breaking with normal wear and use, which could lead to creation of a hole or gap in the shielding material, consequently creating a breach in the electromagnetic shielding effect of the wallet.

Hence, there exists a need for an electromagnetic-shielding wallet or case that holds a plurality of smartcards in more than one sleeve or pocket and allows better visibility of those cards while they are contained in a pocket. Also, the electromagnetic shielding carrying case must not accidentally pivot or fold open while in ones pocket, which would create a breach in the electromagnetic shielding effect. In addition to being able to hold a plurality of smartcards or regular wallet-size cards, the carrying case must also be able to hold paper currency, receipts, tickets, and the like. Moreover, the electromagnetic shielding carrying case or wallet must be able to quickly and easily lock shut and pivot open without the hassle of using zippers or interior flaps. Lastly, the materials used to create the electromagnetic shielding wallet or case must be substantially rigid, durable, and resilient so as to protect the interior electromagnetic shielding material from being bent or broken over time with use.

SUMMARY OF THE INVENTION

The present invention is directed towards an improved electromagnetic shielding carrying case for contactless smartcards and personal articles that is meant to be carried in ones pocket or purse. The electromagnetic shielding carrying case essentially comprises a front panel hingedly connected to a middle panel and a rear panel. The front panel and middle panel further comprise respective electromagnetic shielding members and a card holding means affixed to each. The carrying case has a closed state wherein the upstanding outer walls of the front and rear panels are brought into engagement with one another so as to form an enclosure around the middle panel, thus shielding contactless smartcards within both card holding means from being powered up by an RFID reader. A releasable locking means affixed to a front portion of the rear panel temporarily holds the front panel closed, and can be quickly and easily unlocked so that the front panel pivots open, creating the first open state of the carrying case wherein wallet-size cards, including contactless smartcards, can be slidably inserted and removed from both card holding means. The middle panel can also be pivoted open until it is flush against the front panel to reveal a paper currency pocket within the rear panel that holds paper currency, receipts, and the like.

It is a primary object of this invention to provide an electromagnetic shielding carrying case that shields a plurality contactless smartcards within it from being powered up by an RFID reader, and also prevents accidental opening while contained in ones pocket by providing a releasable locking means that allows a user to quickly and easily lock shut and pivot open the carrying case.

It is another object of this invention to also provide a separate compartment within the electromagnetic shielding carrying case to store paper currency, receipts, tickets, and the like.

It is another object of this invention to allow the electromagnetic shielding carrying case to automatically pivot open and stay held open while a user sorts through cards.

It is still another object of this invention to provide transparent card pockets within the carrying case so as to allow a user maximum visibility of the cards contained in each pocket.

It is still another object of this invention to construct the outer casing of the electromagnetic shielding carrying case out of a substantially rigid and durable material so as to further protect the electromagnetic shielding material within it from bending or breaking with use.

It is still another object of this invention to provide electromagnetic shielding members that are strong, resilient, and durable so as not to bend, tear, or degrade with use, which could consequently create a breach in the electromagnetic shielding effect.

| DRAWINGS-Reference Numerals | |
|---|---|
| 20 hinge pin | 22 rivet |
| 24 self tapping screw | 26 torsion spring |
| 28 compression spring | 30 plurality of wallet-sized cards |
| 100 front panel assembly | |
| 104 first electromagnetic shielding member | 102 front molded shell |
| | 106 triangular ramp members |
| 108 side wall members | 110 semi-rigid roof member |
| 112 first card pocket | 114 rear upstanding wall |
| 116 interior wall | 118 hinge members on front shell |
| 120 protruding edges | 122 hook member |
| 124 first card pocket assembly holes | 126 cavity for rivet stubs |
| 128 first card pocket attachment holes | 130 front shell attachment holes |
| 132 front upstanding wall | 134 opposed sidewalls |
| 136 concave interior surface | 138 adhesive backed vinyl sticker |
| 200 middle panel assembly | 202 formed hinge members |
| 204 second electromagnetic shielding member | 206 u-shaped wall member |
| | 210 semi-rigid roof member |
| 208 finger engaging recess | 300 rear panel assembly |
| 212 second card pocket | 304 hinge members on rear shell |
| 302 rear molded shell | 308 torsion spring cavity |
| 306 rear upstanding wall | 312 recessed ledge |
| 310 leg notch | 316 spring leg pedestal |
| 314 semi-rigid sleeve | 320 latch member hood |
| 318 hinge pin insertion hole | 324 screw bosses on rear shell |
| 322 counter bored holes in hood | 328 pedestal boss insertion holes |
| 326 pedestal bosses | 332 continuous upstanding wall |
| 330 trough for containing latch member | 336 latch member |
| | 340 finger gripping button |
| 334 compression spring chamber | 344 paper currency pocket |
| 338 tapered tongue on latch member | 348 opposed side walls |
| 342 rectangular hole in hood | 400 electromagnetic shielding carrying case |
| 346 front upstanding wall with gap | |
| 350 concave interior surface of rear shell | |
| 402 electromagnetic shielding carrying case with vinyl stickers attached | |

DETAILED DESCRIPTION OF THE PREFERRED EMBODIMENTS

Figure 1:
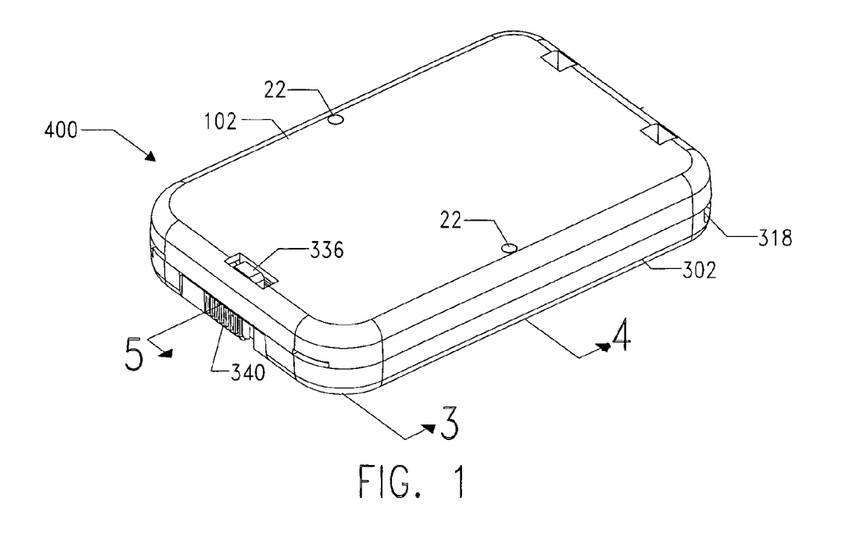
FIG. 1 illustrates schematically an axonometric view of the front side of the electromagnetic shielding carrying case when it is in its closed position.
Figure 6:
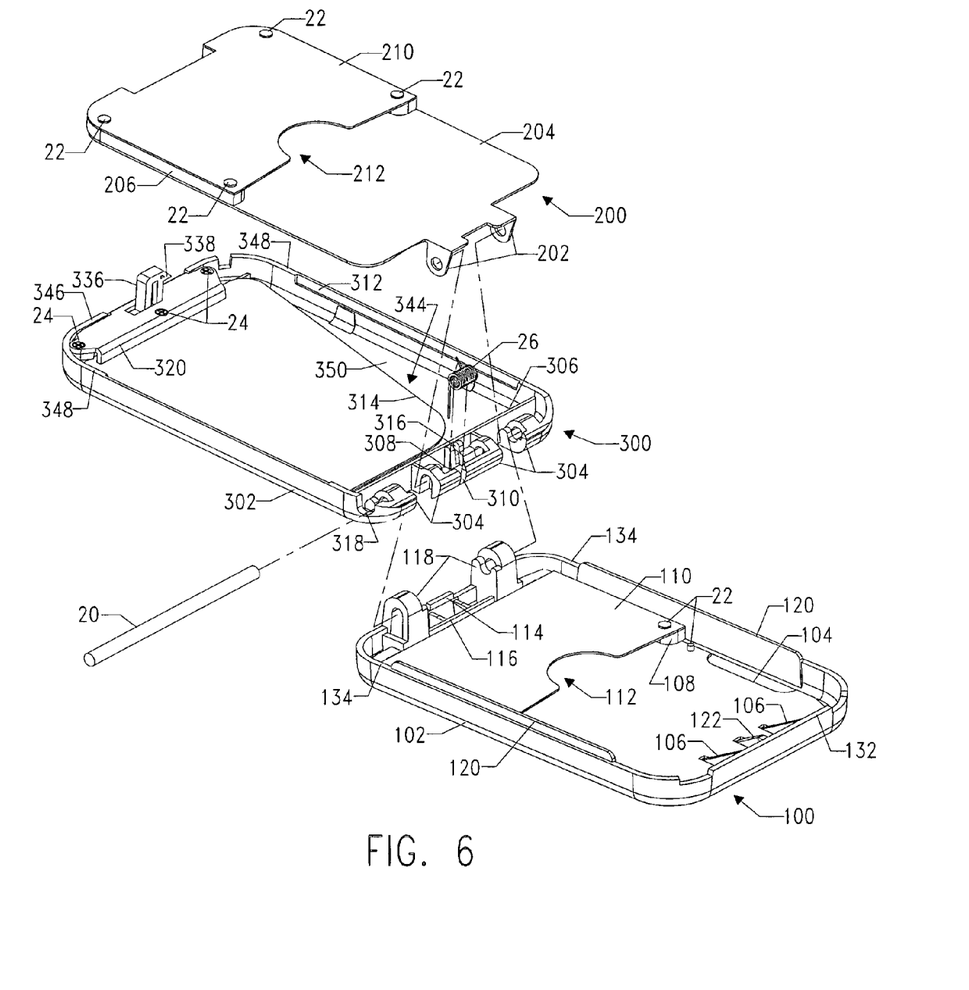
FIG. 6 illustrates schematically a partially exploded axonometric view of the electromagnetic shielding carrying case, divided into its 3 main assemblies.

As used herein, the term "wallet-size cards" is meant to include any card, such as license, credit, check, ATM, membership cards, and contactless smartcards that are approximately 8.5 cm long by 5.5 cm wide and 1 mm or less thick. The electromagnetic shielding carrying case which is the preferred embodiment of the present invention is broadly denoted by the numeral 400 and is shown in its closed state in FIG. 1, in its first open state in FIG. 1A, and in its second open state in FIG. 2A. FIG. 6 shows a partially exploded view of the carrying case when it is separated into its 3 sub assemblies—front panel assembly 100 (see FIG. 7), middle panel assembly 200 (see FIG. 8), and rear panel assembly 300 (see FIG. 9).

Front Panel Assembly

Figure 7:
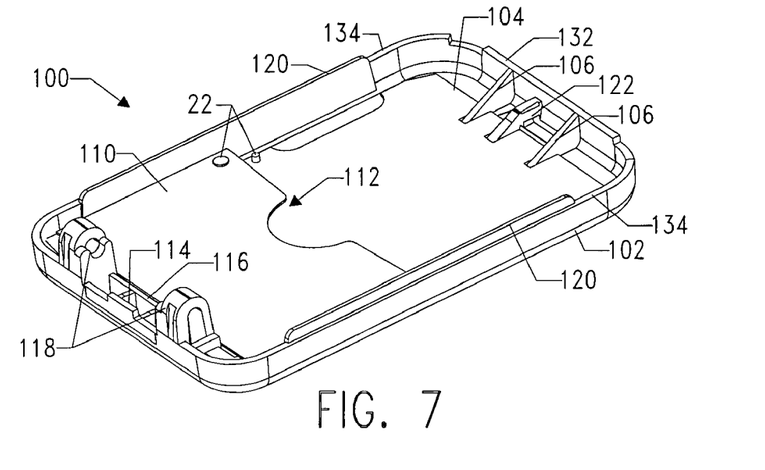
FIG. 7 illustrates schematically an axonometric view of the front panel assembly.
Figure 7A:
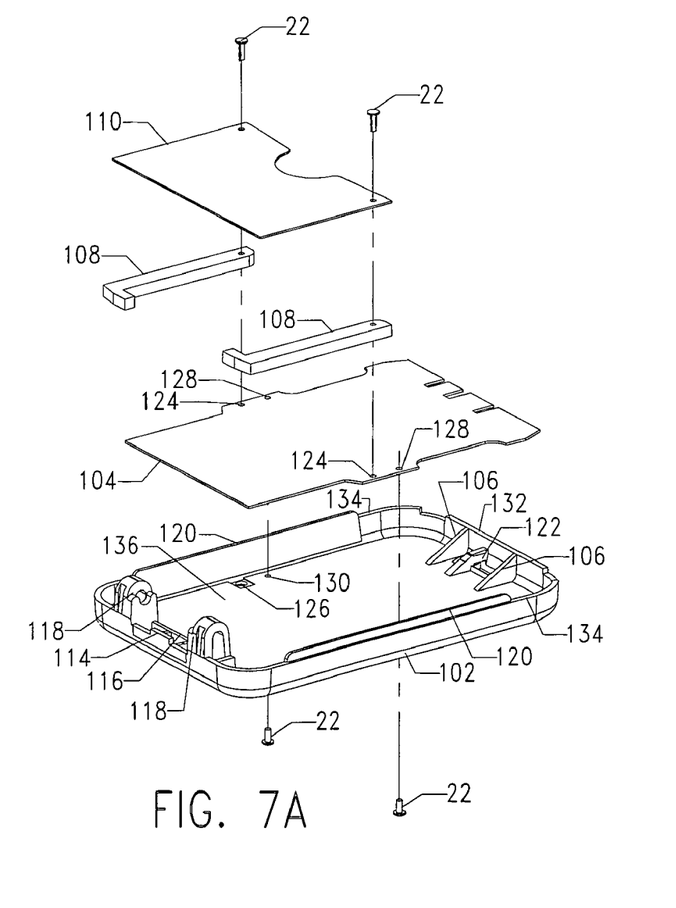
FIG. 7A illustrates schematically an exploded axonometric view of the front panel assembly.

Front panel assembly 100, as shown in FIG. 7, and exploded in FIG. 7A, comprises a molded front shell 102 having a planar four-sided body with a front upstanding wall 132, a pair of opposed upstanding side walls 134, and a rear upstanding wall 114. Walls 132, 134, and 114 are integral with each other and are formed from a molding process. Front shell 102 has a concave interior surface 136 with a pair of through-holes 130 and a pair of rivet-stub cavities 126. Front shell 102 further comprises integral hinge members 118 upstanding from concave interior surface 136 and are affixed to rear upstanding wall 114. A pair of triangular ramp members 106 along with a hook member 122 are upstanding from concave interior surface 136 and are affixed to front upstanding wall 132. A pair of protruding edges 120 extend from side walls 134.

Figure 1A:
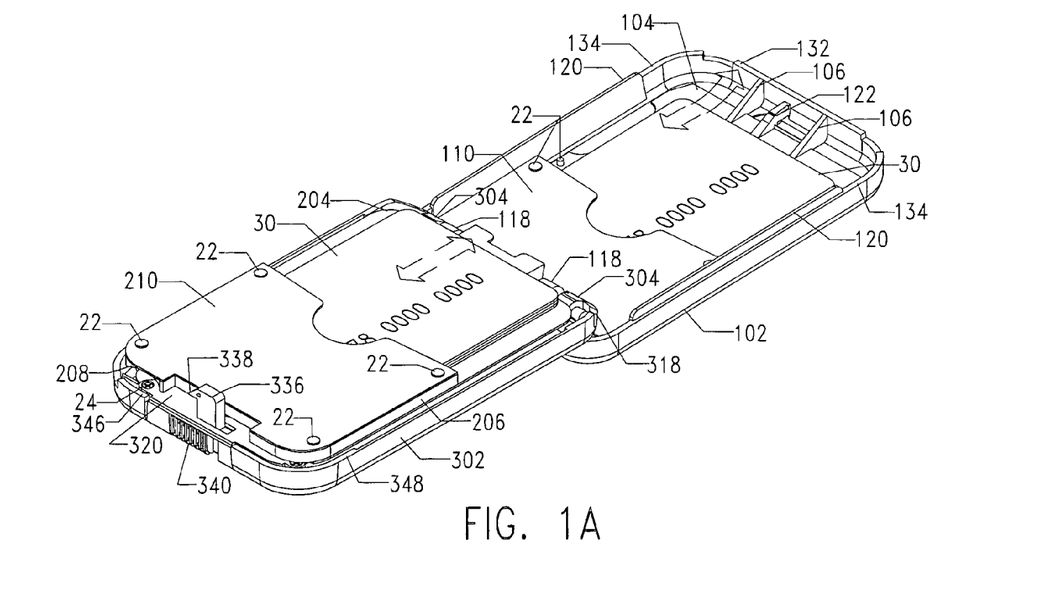
FIG. 1A illustrates schematically an axonometric view of the electromagnetic shielding carrying case when it is in its first open position.

As seen in FIG. 7A, a semi-rigid roof member 110 is attached to side wall members 108 and a first electromagnetic shielding member 104 by rivets 22 which extend through holes 124 and form rivet-stubs that align with rivet stub cavities 126 so that first electromagnetic shielding member 104 can be placed flush against concave interior surface 136. First electromagnetic shielding member 104 is then attached to concave interior surface 136 by extending rivets 22 through holes 130 of front shell 102 and holes 128 of first electromagnetic shielding member 104. A first card pocket 112 is then defined on its sides by side wall members 108, its top by semi-rigid roof member 110, its bottom by first electromagnetic shielding member 104, and its rear by interior wall 116. First card pocket 112 is sized to removably contain a plurality of wallet-size cards 30 which are slidably inserted and removed in a direction parallel to and against triangular ramp members 106 when carrying case 400 is in its first open position (as seen in FIG. 1A). Triangular ramp members 106 are meant to guide plurality of wallet-size cards 30 above front upstanding wall 132 so that they can be removed from front panel assembly 100.

Middle Panel Assembly

Figure 8:
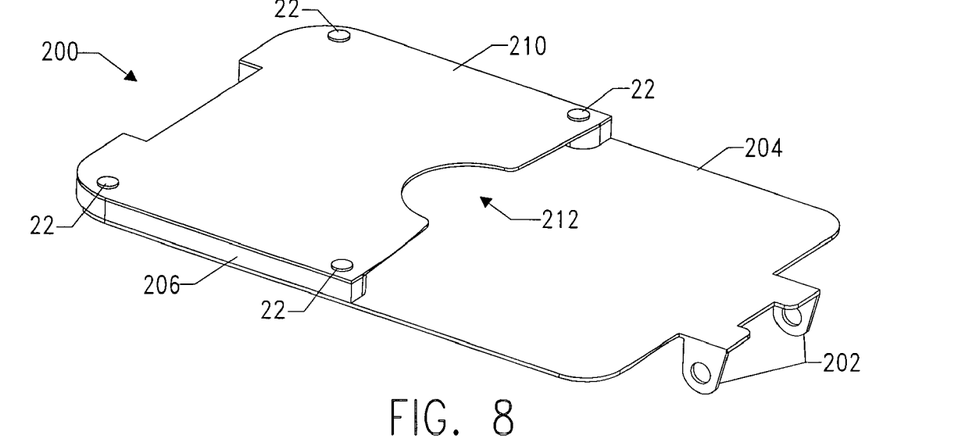
FIG. 8 illustrates schematically an axonometric view of the middle panel assembly.
Figure 8A:
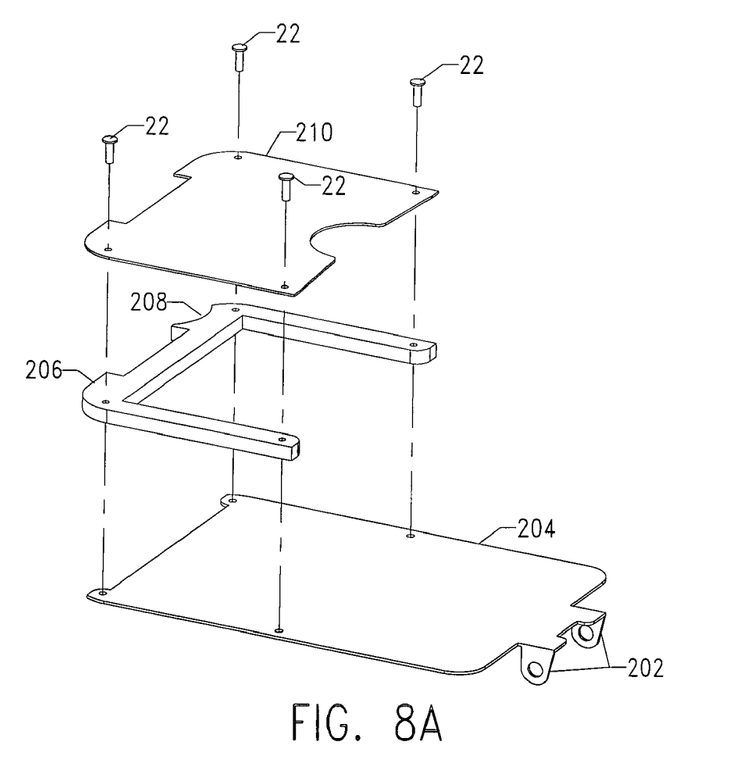
FIG. 8A illustrates schematically an exploded axonometric view of the middle panel assembly.

The middle panel assembly 200, as shown in FIG. 8, and exploded in FIG. 8A, comprises a second electromagnetic shielding member 204 having a pair of upstanding hinge members 202 at its rear. A second semi-rigid roof member 210 is attached to u-shaped wall member 206 and second electromagnetic shielding member 204 by rivets 22. U-shaped wall member 206 has a finger engaging recess 208 at its front end. A second card pocket 212 is then defined on its sides and rear by u-shaped wall member 206, its top by semi-rigid roof member 210, and its bottom by second electromagnetic shielding member 204. Second card pocket 212 is sized to removably contain a plurality of wallet-size cards 30. Plurality of wallet-size cards 30 are slidably inserted and removed in the same direction as cards contained in first card pocket 112 when electromagnetic shielding carrying case 400 is in a first open position (as seen in FIG. 1A).

Rear Panel Assembly

Figure 9:
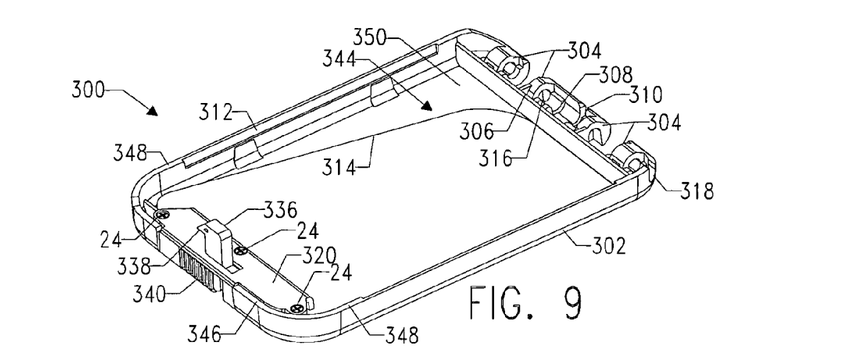
FIG. 9 illustrates schematically an axonometric view of the rear panel assembly.
Figure 9A:
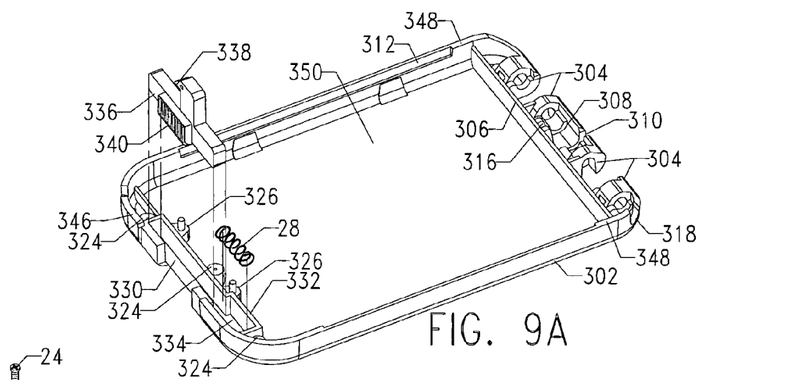
FIG. 9A illustrates schematically a partially exploded axonometric view of the rear panel assembly showing how the latch member and compression spring fit into the trough.
Figures 9B, 10:
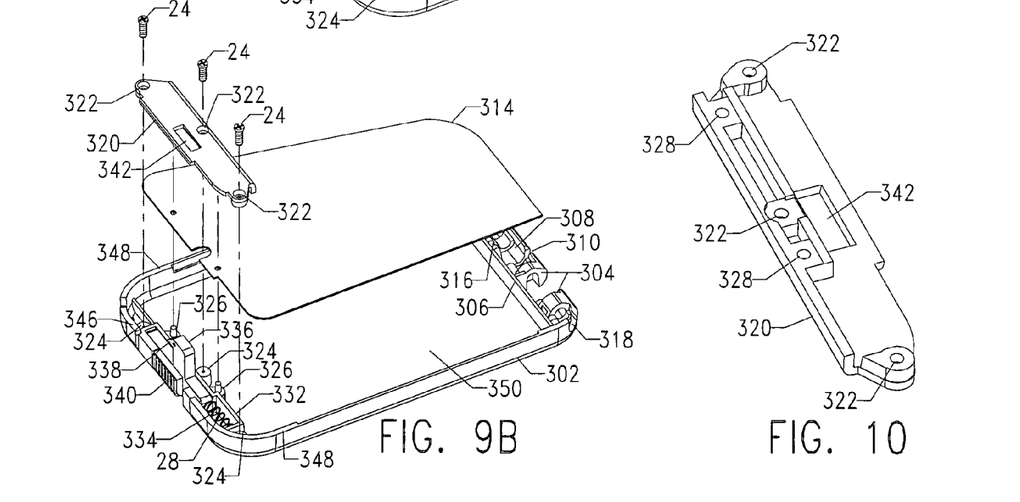
FIG. 9B illustrates schematically a partially exploded axonometric view of the rear panel assembly showing how the latch member hood attaches to the rear panel.
FIG. 10 illustrates schematically an axonometric view of the underside of the latch member hood.

A rear panel assembly 300, as shown in FIG. 9, and partially exploded in FIGS. 9A and 9B, comprises a molded rear shell 302 having a planar four-sided body with a front upstanding wall 346, a pair of opposed side walls 348, and a rear upstanding wall 306. Walls 346, 348, and 306 are integral with each other and are formed from a molding process. Rear shell 302 has a concave interior surface 350 and a plurality of hinge members 304 protruding from rear wall 306. A torsion spring cavity 308 is sandwiched between hinge members 304. Opposed side walls 348 each have an interior recessed ledge 312 that is sized to receive protruding edges 120 of front shell 102 when electromagnetic shielding carrying case 400 is in its closed position. A hinge pin insertion hole 318 is located on the exterior corner of rear shell 302 and is in partial alignment with the holes in hinge members 304.

Referring to FIG. 9A, a rectangular trough 330 is defined by a continuous upstanding wall 332 that rises from a front portion of concave interior surface 350 and is connected to front upstanding wall 346. Inside rectangular trough 330 is a compression spring chamber 334. A compression spring 28 is inserted into compression spring chamber 334, and a latch member 336 is inserted into rectangular trough 330 so that latch member 336 and compression spring 28 are in direct contact with one another. A finger engaging button 340 protrudes from a front portion of latch member 336 and extends through a gap in front upstanding wall 346 (as seen in FIG. 9B). Latch member 336 has an upstanding portion with a tapered tongue 338. Continuous upstanding wall 332 has a pair of pedestal bosses 326 attached behind it that are shaped and sized to receive the holes in semi-rigid sleeve 314 and allow a paper currency pocket 344 to be formed in between semi-rigid sleeve 314 and concave interior surface 350, underneath which paper currency, receipts, and the like can be stored. Semi-rigid sleeve 314 is rigid enough to prevent paper elements from falling out, but flexible enough to be pulled slightly upwards to access paper elements stored beneath it.

Figure 3:
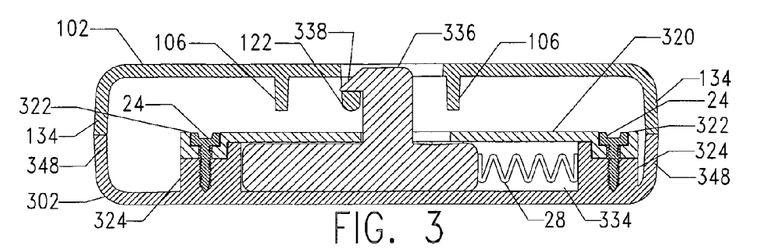
FIG. 3 illustrates schematically a vertical section through the releasable locking mechanism of the electromagnetic shielding carrying case when the locking mechanism is in its locked position and the carrying case is in its closed position.
Figures 3A, 4:
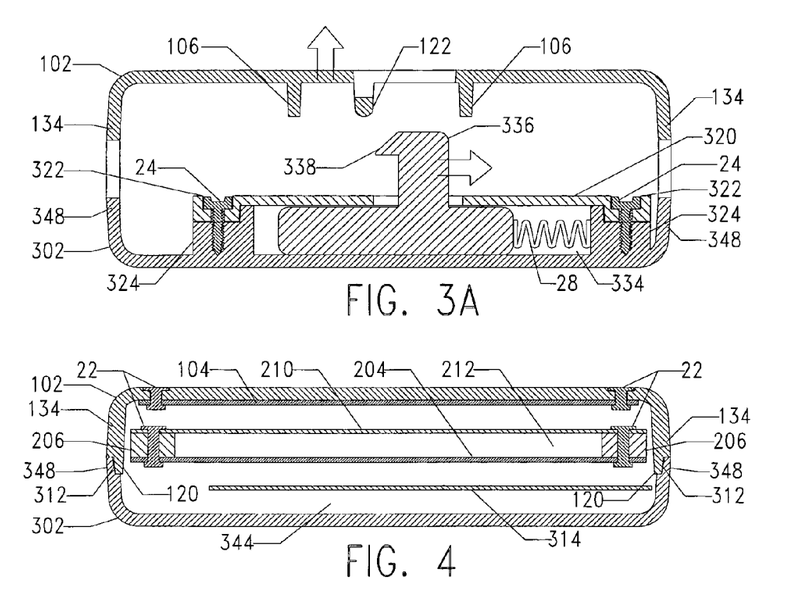
FIG. 3A illustrates schematically a vertical section through the releasable locking mechanism of the electromagnetic shielding carrying case when the latch member is in its unlocked position and is slid to the right, releasing the hook member and allowing the carrying case to start pivoting open.
FIG. 4 illustrates schematically a vertical section through the center width of the electromagnetic shielding carrying case.

Referring to FIG. 9B, in order to keep latch member 336 contained in trough 330 and keep semi-rigid sleeve 314 contained on top of pedestal members 326, a hood 320 is placed over top of continuous upstanding wall 332 and has pedestal boss insertion holes 328 on its underside (see FIG. 10) that are sized to receive pedestal bosses 326, which clamps down on semi-rigid sleeve 314 and prevents it from shifting or moving. Self tapping screws 24 are inserted through counter-bored holes 322 and into screw bosses 324 located around the perimeter of upstanding wall 332. The upstanding portion of latch member 336 with tapered tongue 338 are inserted through a rectangular through-hole 342 in hood 320, the result of which is seen in FIG. 9. Latch member 336 slides between a locked position (FIG. 3) and an unlocked position (FIG. 3A).

Fully Assembled Carrying Case

Figure 5:
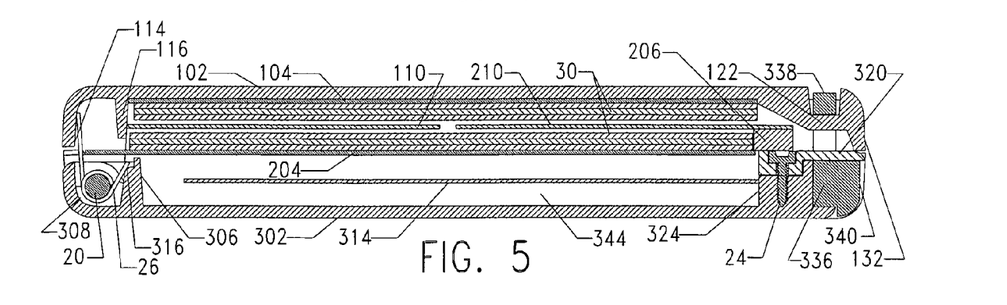
FIG. 5 illustrates schematically a vertical section through the center of the long dimension of the electromagnetic shielding carrying case.

Referring to FIG. 6, a torsion spring 26 is inserted into torsion spring cavity 308 and has a short leg that rests against spring leg pedestal 316 and a long leg that pushes against rear upstanding wall 114 of front shell 102 when the carrying case 400 is in its closed position (as seen sectionally in FIG. 5). Front panel assembly 100, middle panel assembly 200, and rear panel assembly 300 are hingedly connected to one another by extending a hinge pin 20 into insertion hole 318 and through the respective holes of hinge members 118, 202, and 304. Insertion hole 318 is shifted slightly upwards in its relative alignment to the holes in hinge members 304, so as hinge pin 20 is inserted, it slightly flexes to extend through hinge members 304. Once hinge pin 20 is fully inserted, it's circular cross section drops below the circular hole of insertion hole 318 so that the end of hinge pin 20 is now obstructed and cannot slide out of insertion hole 318. Hinge pin 20 is also extended through the hole in torsion spring 26, which keeps the torsion spring 26 held inside torsion spring cavity 308. Thus, it will be observed that carrying case 400 has three basic states:

(i) Closed State (FIGS. 1, 3 and 5): In the closed state, protruding edges 120 of front shell 102 are received snugly within recessed ledges 312 of rear shell 302, creating a rigid closure which prevents front panel 100 from laterally shifting or moving away from rear panel 300. As front panel 100 is pivoted closed, hook member 122 frictionally engages tapered tongue 338 of latch member 336 and forces it to retract against internal compression spring 28, and after hook member 122 pivots clear past tapered tongue 338, tapered tongue 338 becomes unobstructed and is forced to overlap a top portion of hook member 122 by virtue of the pushing force of compression spring 28 against latch member 336, whereby front panel 100 is restrained from pivoting open (seen sectionally in FIG. 3). In the closed state, plurality of wallet-size cards 30, which may include contactless smartcards, are contained in first card pocket 112 and second card pocket 212 and are sandwiched between first electromagnetic shielding member 104 and second electromagnetic shielding member 204 (FIG. 5), so that plurality of wallet-size cards 30 are shielded from being scanned by an RFID reader, thereby preventing unauthorized or accidental access to ones personal data. Moreover, in this closed state, electromagnetic shielding carrying case 400 is locked and cannot physically pivot open while shifting around in ones pocket or bag, thus avoiding the creation of a breach in the electromagnetic shielding effect, and also preventing RFID enabled smartcards from accidentally sliding or falling out of electromagnetic shielding carrying case 400 and being scanned.

(ii) First Open State (FIG. 1A): From its closed state, electromagnetic shielding carrying case 400 will automatically pivot its front panel 100 open when ones finger slides finger engaging button 340 to the right against internal compression spring 28, which simultaneously slides tapered tongue 338 of latch member 336 away from the top portion of hook member 122, and whereby latch member 336 is temporarily in its unlocked position, as seen sectionally in FIG. 3A. The urging force of the long leg of torsion spring 26 against rear upstanding wall 114 is what causes front panel 100 to automatically pivot open. As front panel 100 pivots open, the long leg of torsion spring 26 pivots through leg notch 310 so its rotational path is unobstructed. While in this first open state, plurality of wallet-size cards 30 can be slidably inserted and removed from first card pocket 112 and second card pocket 212 (as seen in FIG. 1A).

Figure 2:
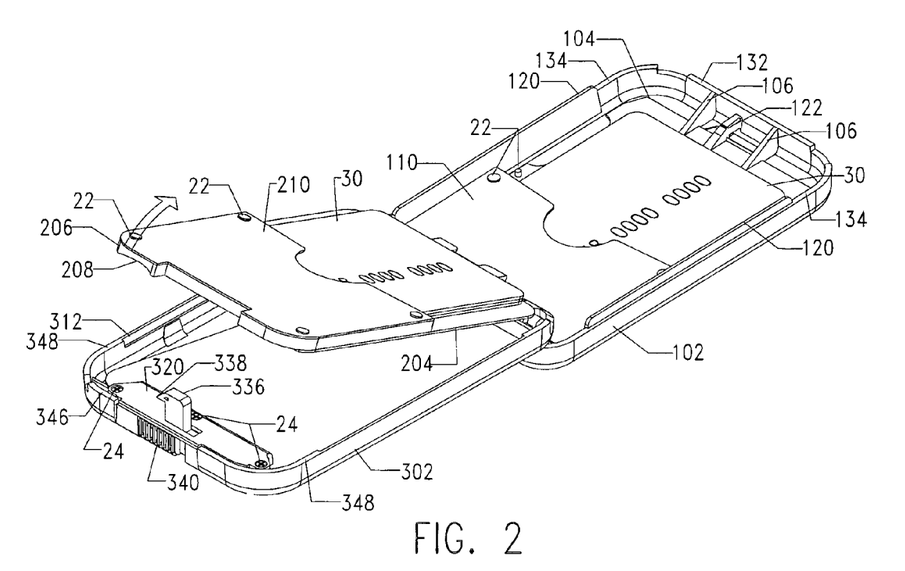
FIG. 2 illustrates schematically an axonometric view of the electromagnetic shielding carrying case when the middle panel is beginning to pivot open.
Figure 2A:
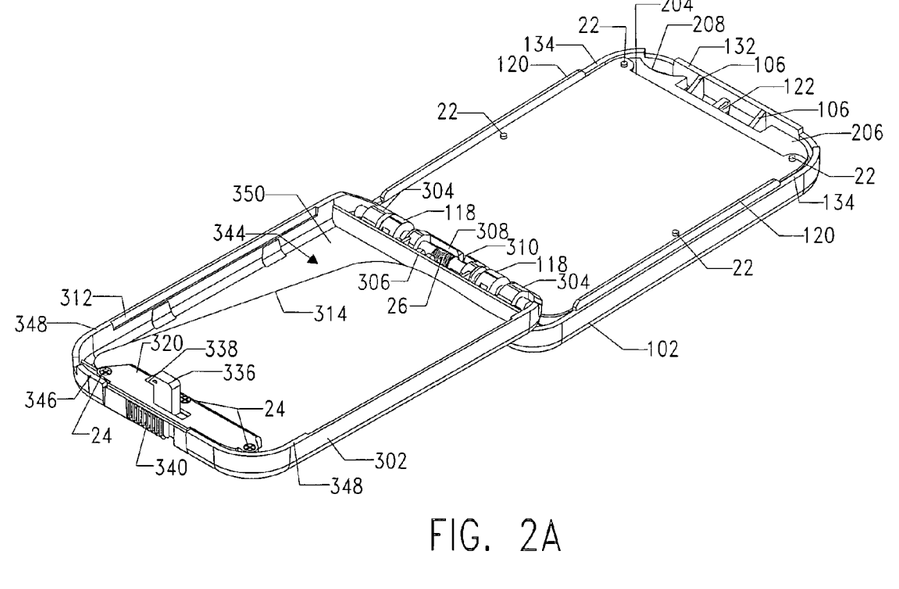
FIG. 2A illustrates schematically an axonometric view of the electromagnetic shielding carrying case in its second open position, revealing the paper currency pocket.

(iii) Second Open State (FIG. 2A): From the first open state, middle panel 200 has a finger engaging recess 208 exposed that is shaped to be gripped with ones finger and lifted upwards (as seen in FIG. 2) thus pivoting middle panel 200 until it is flush up against front panel 100, and revealing paper currency pocket 344 on rear panel 300. In this second open state, paper elements such as paper currency, receipts, tickets, and the like can be inserted and removed from pocket 344. In order to return to the First Open State from the Second open state, finger engaging recess 208 can be gripped by ones finger on the rear of middle panel 200 (as seen in FIG. 2A) and pivoted backwards until first open state is restored. Hence, a user can proactively pivot middle panel 200 back and forth between a first open state and a second open state.

In the preferred embodiment, front shell 102, rear shell, 302, latch member 336, and hood 320 are preferably injection molded out of a durable, light-weight, semi-rigid plastic such as polypropylene or nylon. This is to allow the electromagnetic shielding carrying case 400 to be as light as possible and comfortably carried in ones pocket. The inherent resilient qualities of the aforementioned plastic resins also serve to help the electromagnetic shielding carrying case 400 flex to absorb shock if it is dropped and hits the ground. A material like Polypropylene would be ideal in this scenario because it is known for its resistance to stress cracking and its impact resistance. Front shell 102 and rear shell 302 must be substantially rigid, strong and durable so they can also protect the interior electromagnetic shielding members 104 and 204 from being bent or crushed with use. Though it is also possible to mold front shell 102 and rear shell 302 out of a metal alloy such as aluminum or steel, it is undesirable because it would not only add significant weight to the carrying case 400, but would be more costly to mold and color than plastic, and is prone to denting if dropped, as well as possible rusting. As would be obvious to one skilled in the art, the injection molded components can be molded in colors and textures to satisfy the current tastes and demands of the market.

If desired, a coating known in the industry as a "tactile coating" may be applied to the exterior surfaces of front shell 102 and rear shell 302 to provide more grip for the user. As would be obvious to one skilled in the art, common tactile coatings for injection molded parts may be Thermoplastic Elastomer (TPE) or Thermoplastic Urethane (TPU), and are either spray applied or over-molded onto the surfaces of injection molded parts.

In the preferred embodiment of the present invention, electromagnetic shielding members 104 and 204 are preferably laser-cut or machined from a flat sheet of uniform thickness of aluminum alloy. As would be obvious to one skilled in the art, aluminum alloy inherently has strong electromagnetic shielding properties, good strength and rigidity, and is lightweight. The lightness of the aluminum material is favorable because electromagnetic shielding carrying case 400 is meant to be carried in ones pocket. Also in the preferred embodiment, electromagnetic shielding member 204 has formed hinge members 202 that would originally be flat right after it is laser-cut, but post laser-cutting these hinge members 202 would easily be bent or formed upwards at a 90 degree angle to the rest of electromagnetic shielding member 204. As previously discussed, the electromagnetic shielding members 104 and 204 are made from a durable, resilient sheet instead of an electromagnetic shielding fabric or film in order to eliminate the threat of bending, breaking, or tearing the aluminum over time with use. Laser-cutting or machining the aluminum parts out of a sheet of aluminum material is a very cost efficient process and does not require the high tooling costs of molding.

Also in the preferred embodiment, sleeve member 314, and semi-rigid roof members 110 and 210 of first card pocket 112 and second card pocket 212 respectively, are all preferably made out of a substantially thin, transparent, semi-rigid plastic such as PETG or Acrylic. The transparent material allows the user maximum visibility of wallet-size cards when they are in card pockets 112 and 212, and maximum visibility of paper elements secured under sleeve member 314. This is especially useful for sorting through cards in dimly lit environments, or for people with poor vision. As would be obvious to one skilled in the art, this feature is an improvement over traditional fabric and leather card wallets, which typically provide sleeves or pockets made out of an opaque material for cards to be slidably inserted into, but hinder the user from seeing the whole surface of the card in the pocket.

Lastly, in the preferred embodiment, side wall members 108 and u-shaped wall member 206 are preferably lasercut from a sheet of strong, semi-flexible material such as polypropylene or nylon. Wall members 108 and 206 are merely two-dimensional profiles and can be efficiently lasercut out of a sheet of material. Also in the preferred embodiment, hinge pin 20 is preferably made out of a semi-rigid, durable material that has low friction and good abrasion resistance such as nylon, so that it can endure the friction from all of the hinge members pivoting around it.

Figure 11:
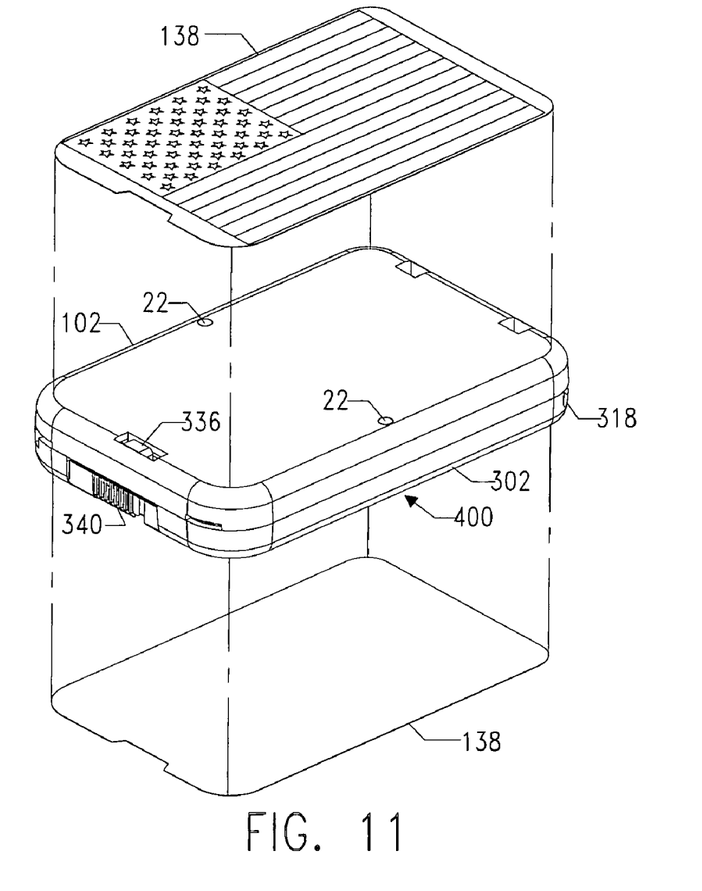
FIG. 11 illustrates schematically an axonometric view of the electromagnetic shielding carrying case as an adhesive backed sticker with printed graphics is applied to its exterior surfaces.
Figure 11A:
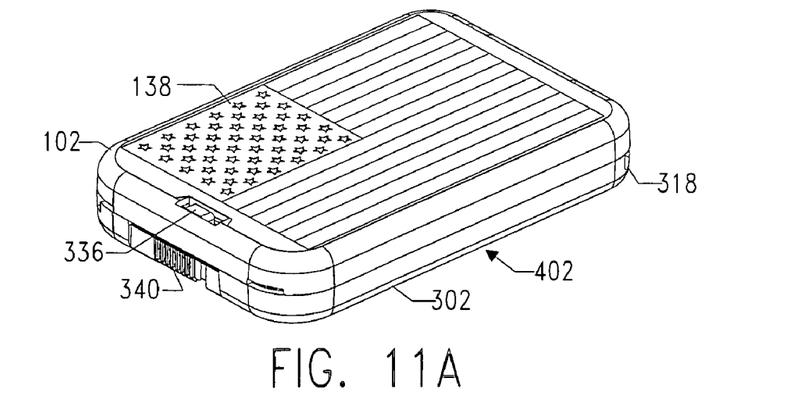
FIG. 11A illustrates schematically an axonometric view of the electromagnetic shielding carrying case with an adhesive backed sticker applied to its exterior surfaces.

As seen in FIGS. 11 and 11A, if desired, an adhesive backed vinyl sticker 138 with printed graphics can be applied to the exterior surfaces of front shell 102 and rear shell 302 to protect the exterior surfaces from being scratched and allow a user to customize the exterior graphic appearance of the electromagnetic shielding carrying case 400. An example of this can be seen embodied in electromagnetic shielding carrying case with vinyl stickers 402 in FIG. 11A.

SUMMARY, RAMIFICATIONS, AND SCOPE

Accordingly, the reader will see that the electromagnetic shielding carrying case for contactless smartcards and personal articles presented can be used to prevent unauthorized or accidental access to the contents of a plurality of contactless smartcards contained within it, and will not accidentally pivot open while contained in ones pocket or bag. Furthermore, the electromagnetic shielding carrying case has additional advantages in that:

The releasable locking means on the front of the carrying case can be instantly unlocked by simply sliding ones finger across the front button, which instantly forces the carrying case to automatically pivot itself open, thus allowing a user to both unlock and open the carrying case with minimal effort;

A plurality of wallet-size cards, including contactless smartcards, can be contained in more than one card pocket, and are physically prevented from accidentally falling or sliding out of the electromagnetic shielding carrying case when it is in its closed position;

The card pockets within the electromagnetic shielding carrying case are transparent, which allows a user maximum visibility of the topmost card inside each pocket, which is helpful for sorting through cards in dimly lit environments or for people with poor vision. Moreover, this feature allows a user to display their driver's license or other identification cards to someone without ever removing the cards from the carrying case;

The electromagnetic shielding members within the electromagnetic shielding carrying case also help prevent the magnetic strips on cards from being demagnetized by external magnetic sources when the carrying case is in its closed position;

In addition to holding a plurality of wallet size cards in both its card pockets, the electromagnetic shielding carrying case has a separate compartment for storing paper elements such as paper currency, receipts, tickets, pictures, and the like;

The strong, resilient outer shells of the electromagnetic shielding carrying case prevent the internal electromagnetic shielding members from being crushed, bent, or damaged with use;

The injection molded outer shells of the carrying case could easily be molded into different colors and textures to meet the current tastes and demands of the market;

The market for contactless smartcards could be expanded by this invention by assuaging a card owners concerns over privacy and security by giving them the ability to protect the information on their contactless smartcards.

It will be appreciated that still further embodiments of the present invention will be apparent to those skilled in the art in view of the present disclosure. It is to be understood that the present invention is by no means limited to the particular constructions herein disclosed and/or shown in the drawings, but also comprises any modifications or equivalents within the scope of the invention. Accordingly, the scope of the invention should be determined not by the embodiment illustrated, but by the appended claims and their legal equivalents.

I claim:

1. An electromagnetic shielding carrying case for contactless smartcards and personal articles, the electromagnetic shielding carrying case comprising:
   a front panel comprising:
   (i) a front shell comprising a rectangular planar body having front, rear, left, and right sides, and a first continuous wall upstanding from said front, rear, left and right sides, said front shell having a concave interior surface surrounded on all sides by said first continuous wall, said front shell further comprises both a hook member and at least one ramp member that are upstanding from a front portion of said concave interior surface of said front shell and are affixed to an interior portion of said first continuous wall at said front side of said front shell;

(ii) a first hinge element affixed to a portion of said first continuous wall at said rear side of said front shell;

(iii) a first electromagnetic shielding member comprising a substantially rigid four-sided planar body and having an area that substantially covers a contactless smartcard, said first electromagnetic shielding member being affixed to said concave interior surface of said front shell, said first electromagnetic shielding member having a top face with a front portion and a rear portion;

(iv) a first card holding means affixed to said rear portion of said top face of said first electromagnetic shielding member, said first card holding means being adapted to removably contain a plurality of contactless smartcards, said plurality of contactless smartcards being slidably inserted and removed parallel to and against said at least one ramp member, whereby said at least one ramp member helps restrict said plurality of contactless smartcards from sliding out of said first card holding means, said at least one ramp member also guides said plurality of contactless smartcards above said continuous wall at said front side of said front shell so as to allow said plurality of contactless smartcards to be removed from said front panel;

a middle panel comprising:

(i) a second electromagnetic shielding member comprising a substantially rigid four-sided planar body and having an area that substantially covers a contactless smartcard, said second electromagnetic shielding member further comprises a top face with a front portion and a rear portion;

(ii) a second hinge element affixed to said rear portion of said top face of said second electromagnetic shielding member;

(iii) a second card holding means affixed to said front portion of said top face of said second electromagnetic shielding member, said second card holding means being adapted to removably contain a plurality of contactless smartcards, said plurality of contactless smartcards are slidably inserted and ejected from said second card holding means;

a rear panel comprising:

(i) a rear shell comprising a rectangular planar body having front, rear, left, and right sides, and a second continuous wall upstanding from said front, rear, left and right sides of said rear shell, said rear shell having a concave interior surface surrounded on all sides by said second continuous wall;

(ii) a third hinge element affixed to a portion of said second continuous wall at said rear side of said rear shell;

(iii) a releasable locking means integrated with a portion of said second continuous wall at said front side of said rear shell;

(iv) a receptacle formed by said concave interior surface of said rear shell and enclosed on its sides by said second continuous wall for removably containing paper currency, receipts, tickets, and the like;

a linking means for rotatably linking said first, second, and third hinge elements so as to rotatably link said front and middle panels to said rear panel so that said first continuous wall of said front panel and said second continuous wall of said rear panel can be brought into engagement with one another so as to form an enclosure around said middle panel when said electromagnetic shielding carrying case is in a closed position, and wherein said receptacle is closed off by said middle panel when said electromagnetic shielding carrying case is in said closed position;

an urging means affixed to said linking means having a constant force against an interior portion of said first continuous wall at said rear side of said front shell so as to constantly force said front panel to pivot open;

said front shell and said rear shell are made from a substantially rigid, durable material that resists bending and crushing forces so as to protect said first and second electromagnetic shielding members contained within said electromagnetic shielding carrying case from being bent, deformed, or broken with use;

said releasable locking means on said rear panel automatically grasps said hook member when said front panel is pivoted closed so as to prevent said front panel from pivoting open and allow said first electromagnetic shielding member on said front panel and said second electromagnetic shielding member on said middle panel to sandwich said plurality of contactless smartcards contained in said first and second card holding means so as to shield said plurality of contactless smartcards from being activated by a radio frequency identification reader or sensor;

said releasable locking means can be released from said hook member to allow said front panel to automatically pivot open, whereby said front panel holds itself open for a user while they sort through said first and second card holding means when said electromagnetic shielding carrying case is in a first open position;

said middle panel can be pivoted open until it is flush against said front panel so as to allow a user to access and store paper elements contained within said receptacle on said rear panel when said electromagnetic shielding carrying case is in a second open position, said middle panel can also be pivoted back to its original position so as to return said electromagnetic shielding carrying case to said first open position from said second open position.

2. The electromagnetic shielding carrying case according to claim 1, wherein said first, second, and third hinge elements each comprise at least one hinge member having a hole defined therethrough, and wherein said linking means further comprises a hinge pin that is extended through said hole of said at least one hinge member of said first, second, and third hinge elements for rotatably linking the same.

3. The electromagnetic shielding carrying case according to claim 1, wherein said releasable locking means on said rear shell further comprises:

(i) a trough portion defined on 3 sides by a continuous upstanding wall and a 4th side by said second continuous wall at said front side of said rear shell, said second continuous wall further comprising a gap at said front side of said rear shell;

(ii) a latch member having an upstanding portion with a tapered tongue, and an external finger engaging button that protrudes out from said gap in said second continuous wall, said latch member is slidably contained within said trough portion;

(iii) a compression spring disposed adjacent to said latch member within said trough portion;

(iv) a hood member having a slot defined therethrough, said hood member is affixed to the top portion of said continuous upstanding wall so as to enclose said latch member and said compression spring within said trough portion and wherein said upstanding portion with tapered tongue protrudes out from said slot in said hood member;

said compression spring has an urging force against said latch member so as to keep said latch member in a temporarily locked position wherein said tapered tongue temporarily overlaps said hook member of said front panel so as to keep said front panel closed against said rear panel, and whereby said tapered tongue can be slidably removed from said hook member by using ones finger to slide said finger engaging button in a direction against said compression spring thus allowing said front panel to automatically pivot open as said latch member is in its unlocked position, said tapered tongue has an angled top surface that is frictionally engaged by said hook member as said front panel is pivoted closed forcing said tapered tongue to first retract backwards to said unlocked position and then overlap said hook member by virtue of the force of said compression spring against said latch member, whereby said tapered tongue on said latch member automatically grasps said hook member as said front panel is pivoted closed, and whereby a user can lock shut or pivot open said electromagnetic shielding carrying case using minimal effort.

4. The electromagnetic shielding carrying case according to claim 1 wherein said first and second electromagnetic shielding members are made from substantially rigid aluminum alloy having sufficient electromagnetic shielding properties to block a smartcard from being powered up by a radio frequency identification reader or sensor.

5. The electromagnetic shielding carrying case according to claim 1 wherein said front shell and said rear shell are made of polypropylene.

6. The electromagnetic shielding carrying case according to claim 1 wherein said urging means further comprises a torsion spring with a passage defined therethrough, said torsion spring having a first leg urging against an interior portion of said first continuous wall at said rear side of said front shell, and a second leg urging against a portion of said second continuous wall at said rear side of said rear shell, and wherein said linking means is able to be extended through said passage of said torsion spring.

7. The electromagnetic shielding carrying case according to claim 1 wherein said receptacle further includes a transparent semi-rigid sleeve member affixed to a rear portion of said releasable locking means and extending over top of said concave interior surface of said rear shell thus defining a pocket in between said semi-rigid sleeve member and said concave interior surface of said rear shell inside which paper currency, receipts, tickets, and the like can be stored.

8. The electromagnetic shielding carrying case according to claim 1, wherein said first card holding means further comprises side wall members having means for attachment to said rear portion of said top face of said first electromagnetic shielding member, and a first roof member affixed to the top portions of said side wall members thus defining a first card pocket against said top face of said first electromagnetic shielding member, and wherein said second card holding means further comprises a u-shaped wall member having means for attachment to said front portion of said top face of said second electromagnetic shielding member, and a second roof member affixed to the top portion of said u-shaped wall member thus defining a second card pocket against said top face of said second electromagnetic shielding member.

9. The electromagnetic shielding carrying case according to claim 8 wherein said first and second roof members are transparent so as to allow improved visibility of cards contained within said first and second card pockets.

10. The electromagnetic shielding carrying case according to claim 1 wherein the exterior surface area of said front shell and said rear shell further includes an adhesive backed vinyl sticker with printed graphics so as to protect the exterior surfaces from being scratched and allow a user to customize the graphic appearance of said electromagnetic shielding carrying case.

* * * * *